United States Patent
Minoia et al.

(10) Patent No.: US 9,229,250 B2
(45) Date of Patent: Jan. 5, 2016

(54) ELECTRO-OPTICAL MODULATOR INTERFACE

(71) Applicant: STMICROELECTRONICS S.R.L., Agrate Brianza (IT)

(72) Inventors: Gabriele Minoia, Pavia (IT); Salvatore Galeone, Taranto (IT); Enrico Stefano Temporiti Milani, Pavia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 289 days.

(21) Appl. No.: 14/043,547

(22) Filed: Oct. 1, 2013

(65) Prior Publication Data

US 2014/0104666 A1    Apr. 17, 2014

(30) Foreign Application Priority Data

Oct. 11, 2012  (IT) .............................. MI2012A1714

(51) Int. Cl.
| | |
|---|---|
| *H03K 19/0175* | (2006.01) |
| *G02F 1/01* | (2006.01) |
| *H03K 19/0185* | (2006.01) |
| *G02F 1/225* | (2006.01) |

(52) U.S. Cl.
CPC .............. *G02F 1/0121* (2013.01); *G02F 1/225* (2013.01); *H03K 19/018521* (2013.01); *H03K 19/018528* (2013.01); *G02F 2201/126* (2013.01)

(58) Field of Classification Search
CPC . G02F 1/0121; G02F 1/225; G02F 2201/126; H03K 19/018521; H03K 19/018528
See application file for complete search history.

(56) References Cited

U.S. PATENT DOCUMENTS

| | | |
|---|---|---|
| 7,039,258 B2 | 5/2006 | Gunn, III et al. |
| 7,450,787 B2 | 11/2008 | Kucharski et al. |
| 7,515,775 B1 | 4/2009 | Kucharski et al. |
| 7,626,440 B1 | 12/2009 | Atesoglu |

(Continued)

FOREIGN PATENT DOCUMENTS

| | | |
|---|---|---|
| EP | 0681199 A2 | 4/1995 |
| WO | 2012072726 A1 | 6/2012 |

OTHER PUBLICATIONS

Woodward, T.K. et al., Modulator-driver circuits for optoelectronic VLSI, IEEE Photonics Technology Leters, IEEE Service enter, Piscataway, NJ, US, vol. 9, No. 6, Jun. 1, 1997, pp. 839-841.

(Continued)

*Primary Examiner* — Jung Kim
(74) *Attorney, Agent, or Firm* — Allen, Dyer, Doppelt, Milbrath & Gilchrist, P.A.

(57) ABSTRACT

A relatively high-speed, high-efficiency CMOS two branch driver core that may operate under relatively low supply voltage may include thin oxide CMOS transistors configured to generate rail-to-rail output swings larger than twice a supply voltage and without exceeding safe operating area limits. Each of the two branches may include two stacked CMOS inverter pairs configured to drive a respective load capacitance coupled between respective CMOS inverter outputs, in phase opposition to the other branch. A pre-driver circuit input with a differential modulating signal may output two synchronous differential voltage drive signals of a swing of half of the supply voltage and DC-shifted by half of the supply voltage with respect to each other and that may be applied to the respective CMOS inverter inputs of the two branches.

16 Claims, 6 Drawing Sheets

(56) References Cited

U.S. PATENT DOCUMENTS

| | | | |
|---|---|---|---|
| 7,899,276 B2 | 3/2011 | Kucharski et al. | |
| 8,629,705 B2 * | 1/2014 | Chang | H02M 3/07 327/333 |
| 2005/0213993 A1 | 9/2005 | Kazemi-Nia et al. | |
| 2010/0214014 A1 * | 8/2010 | Dennard | H02M 3/07 327/541 |

OTHER PUBLICATIONS

Long A., Buck, J., and Powell, R., "Design of an opto-electronic modulator driver amplifier for 40-Gb/s data rate systems," Lightwave Technology Journal, vol. 20, (2002), pp. 2015-2021.

Dogru S., JaeHyuk Shin, and Dagli, N., "Ultra-low voltage substrate-removed mach-zehnder intensity modulators with integrated electrical drivers," LEOS Annual Meeting Conference Proceedings, 2009, LEOS '09, IEEE, (2009), pp. 656-657.

Analui B., Guckenberger, D., Kucharski, D., and Narasimha, A., "A Fully Integrated 20-Gb/s Optoelectronic Transceiver Implemented in a Standard 13-CMOS SOI Technology," IEEE Journal of Solid-State Circuits, vol. 41, 2006, pp. 2945-2955.

Palaniappan, A. and Palermo, S., "Power Efficiency Comparisons of Interchip Optical Interconnect Architectures," IEEE Transactions on Circuits and Systems II, Express Briefs, vol. 57, (2010), pp. 343-347.

Joohwa, Kim and Buckwalter, J.F., "A 40-Gb/s Optical Transceiver Front-End in 45 nm 501 CMOS," IEEE Journal of Solid-State Circuits, vol. 47, 2012, pp. 615-626.

* cited by examiner

ELECTRO-OPTICAL MODULATOR INTERFACE

FIELD OF THE INVENTION

This disclosure relates in general to electrical-optical (E-O) interfaces that use a rail-to-rail driving voltage of a differential capacitive load at high speed for high speed communications, and in particular, to silicon based photonics applications, for example, for applications with two capacitive loads to be driven in phase opposition.

BACKGROUND OF THE INVENTION

Electrical-Optical (E-O) interfaces are used in high-speed communication systems to convert an electrical signal into an optical signal. Typically, the E-O interface core includes a modulator configured to generate modulated light power as a function of an electrical signal, and a driver which receives, at an input, the electrical signal from preceeding electronic stages and drives the modulator with voltage and current of sufficient magnitudes.

The driver may be increasingly important in high data rate (DR) applications, since relatively large output voltage levels with steep rising and falling edges may be desired for proper operation of the modulator and with limited jitter so as to not degrade the transmitted bit stream. At the same time, it may be desirable that the driver be designed to reduce its power consumption since it may contribute to the overall power budget of a typical optical link.

In the specific case of Mach Zehnder Modulators (MZMs), due to the geometrical size of the interferometer used to build the MZM, for high speed operation, the driver is often split into several stages. Each stage may drive a portion of the MZM. Thus, a distributed modulating structure may be formed. In this case, it may be desirable that the driver stages allow their intrinsic delays to be programmable for proper operation of the distributed architecture by equalizing the optical delay of the light propagating within the MZM optical guides, with the delay of the electrical signal propagating through the distributed driver stages.

The load to be driven generally includes a plurality of reverse-biased junctions (e.g. MZMs), with an equivalent circuit including a capacitive load. Typical high speed driver implementations at data rates of tens of GHz rely on relatively expensive materials, such as Gallium Arsenide, Indium Phosphide, Indium Gallium Arsenide, or expensive technological platforms, such as, Silicon-On-Insulator, and make use of relatively large supply voltages (e.g. 5V). Recently, silicon CMOS and BiCMOS implementations are being proposed, in particular, for silicon photonics applications. Common high speed driver architectures include travelling wave amplifiers using cascoded cells, as described in "Design of an optoelectronic modulator driver amplifier for 40-Gb/s data rate systems," Long, A., Buck, J., and Powell, R., Journal of Lightwave Technology, Volume: 20, 2002 Page(s) 2015-2021, and "Ultra-low voltage substrate-removed mach-zehnder intensity modulators with integrated electrical drivers," Dogru, S., JaeHyuk Shin, and Dagli, N., LEOS Annual Meeting Conference Proceedings, 2009, LEOS '09, IEEE, Page(s) 656-657, or differential pairs, as described in "A Fully Integrated 20-Gb/s Optoelectronic Transceiver Implemented in a Standard 13-CMOS SOI Technology," Analui, B., Guckenberger, D., Kucharski, D., and Narasimha, A., IEEE Journal of Solid-State Circuits, Volume 41, 2006, Page(s) 2945-2955 and "Power Efficiency Comparisons of Interchip Optical Interconnect Architectures," Palaniappan, A. and Palermo, S., IEEE Transactions on Circuits and Systems II, Express Briefs, Volume 57, (2010), Page(s) 343-347.

MOS transistors with thin gate oxide formed with the most advanced technology nodes may lend themselves to the realization of high speed drivers, for example, as described in "A 40-Gb/s Optical Transceiver Front-End in 45 nm SOI CMOS," Joohwa Kim and Buckwalter, J. F., IEEE Journal of Solid-State Circuits, Vol. 47, 2012, Page(s) 615-626, and U.S. Pat. Nos. 7,899,276, 7,515,775, 7,450,787 to Kucharski et al. and U.S. Pat. No. 7,039,258 to Gunn, III et al. However, due to the oxide thinness, they may be subject to Safe Operating Area (SOA) issues when used in drivers with a relatively large output voltage (e.g. >2V), as may be with typical modulator implementations (e.g. MZMs).

SUMMARY OF THE INVENTION

Using a relatively low cost CMOS technological platform for fabricating integrated E-O interfaces and related modulator circuitry could significantly lower the cost of such devices if SOA issues could be overcome with little if any prejudice to the ability to drive the reverse junctions of the modulator at a sufficiently large voltage that would ensure proper operation. Thus, a relatively high-speed, high-efficiency CMOS driver operating under relatively low supply voltage (e.g. 2.5V, suitable for use in optical modules with maximum available voltage <3.3V) may be made by generating a single-polarity (e.g. 0 to 2.5V, instead of −1.25V to 1.25V) differential output voltage with a rail-to-rail output swing. The driver addresses the desired requirements of an optical modulator driver operating at high data rate, as discussed above, while allowing the E-O interface to be formed with relatively low cost technologies and using a relatively low supply voltage (e.g. 2.5V-3.3V).

The thin oxide CMOS transistors used to generate rail-to-rail output swings that may be larger than twice their nominal maximum supply voltage may be generated so as to not exceed SOA limits. The driver may be particularly suitable for the formation of fully integrated E-O interfaces, e.g. on a silicon photonics technological platform (either with monolithic integration of electronics with photonics, or with twin assembled dies, one dedicated to electronics and one to photonics). Of course it may also be useful for more traditional E-O interface architectures. The driver may be used with any kind of optical modulator (e.g. Mach Zehnder, Ring Resonator, Electro Absorption Modulator).

More generally, the driver may be used in any application requiring rail-to-rail driving of a differential capacitive load at a high speed. In its differential configuration, the drive may be suitable for use in applications with two capacitive loads to be driven in phase opposition.

DETAILED DESCRIPTION OF THE PREFERRED EMBODIMENTS

Figure 1:
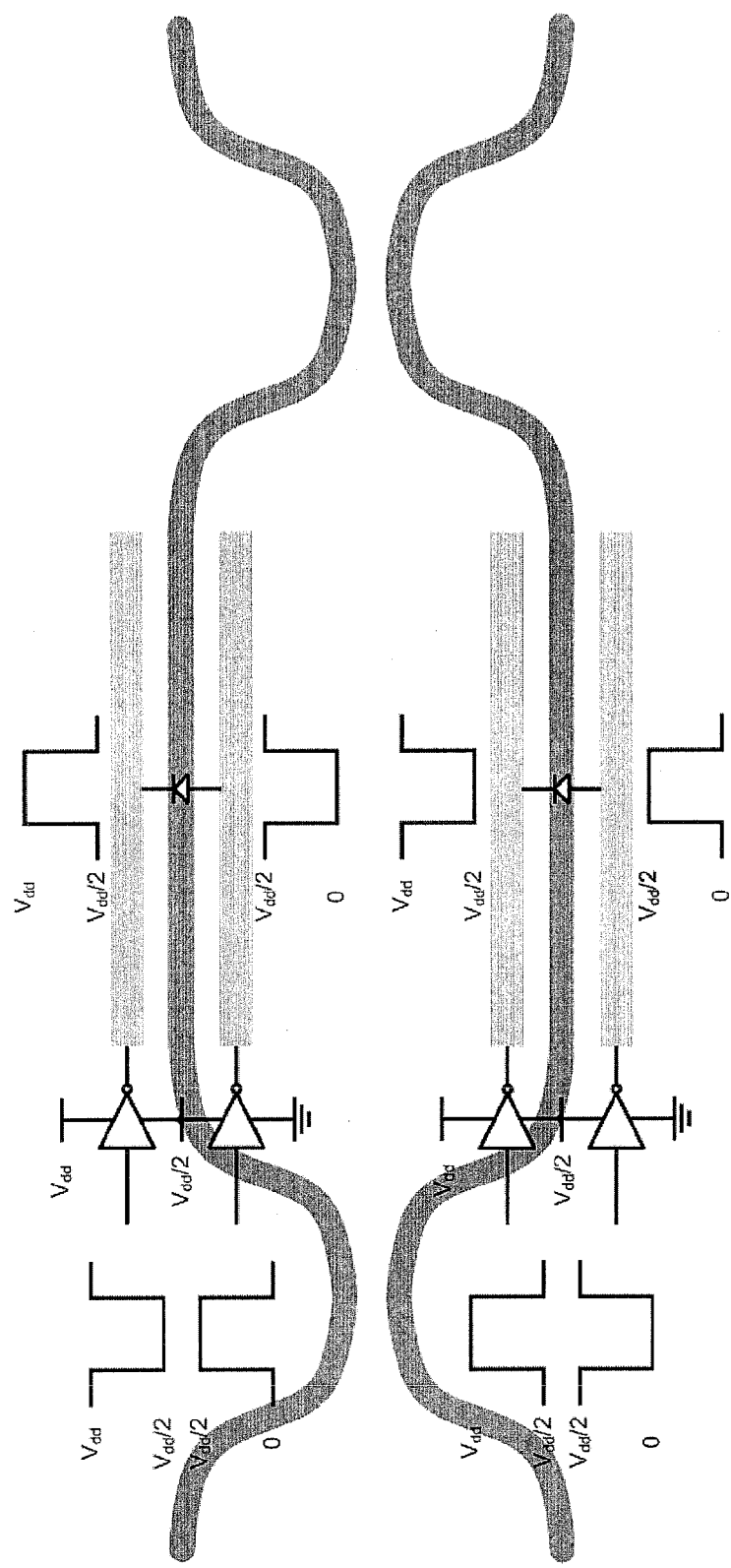
FIG. 1 is a schematic diagram of a silicon integrated E-O modulator interface in a differential configuration in an MZM wherein four electrodes are driven according to an embodiment of the present invention.
Figure 2:
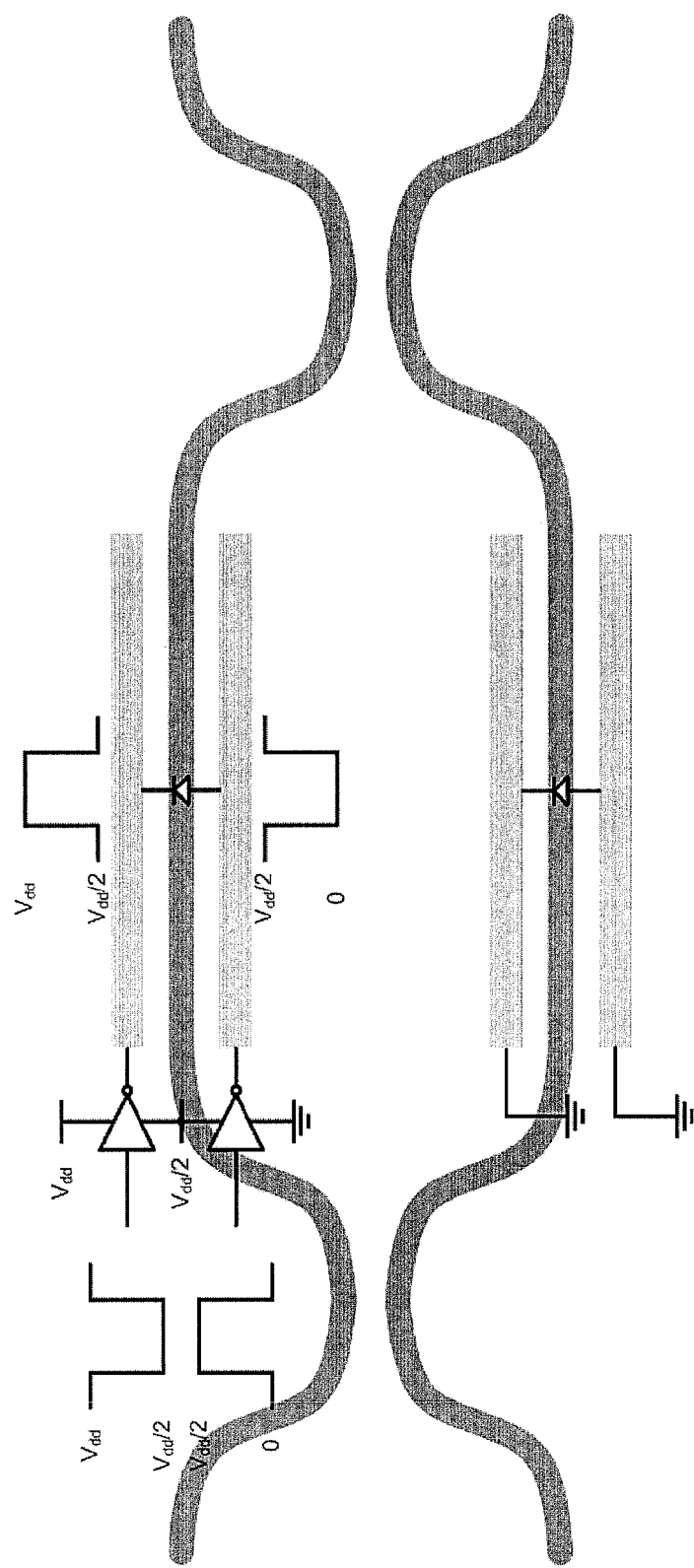
FIG. 2 is a schematic diagram of a silicon integrated E-O modulator interface in a single-ended configuration in an MZM wherein only two electrodes are driven according to an embodiment of the present invention.

Exemplary embodiments of the driver will be described in a differential configuration, according to which all the four electrodes are driven, with either a lumped or distributed structure. This configuration may be useful, for example, in an MZM where all the four electrodes are driven as depicted in FIG. 1, and it may be more easily converted into a single-ended one, for use in an MZM where only two electrodes are driven as depicted in FIG. 2.

Figure 3A:
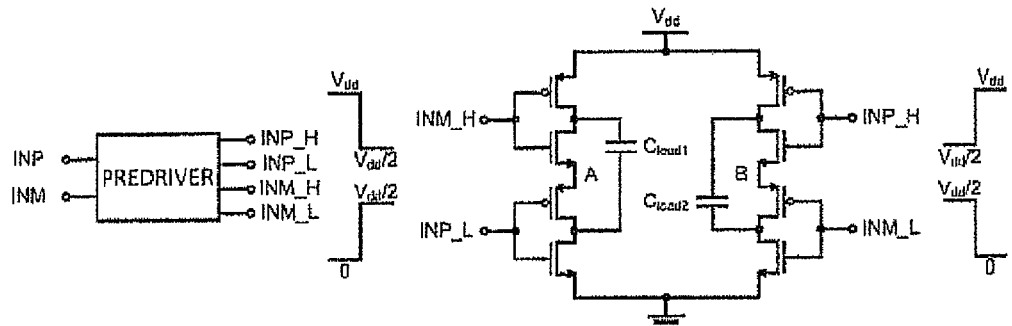
FIGS. 3a-3d are schematic circuit diagrams of an output stage of an interface driver according to embodiments of the present invention.
Figure 3B:
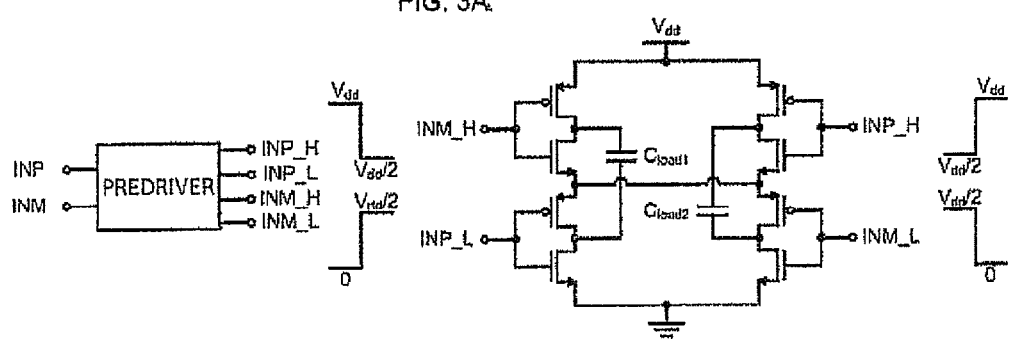
Figure 3C:
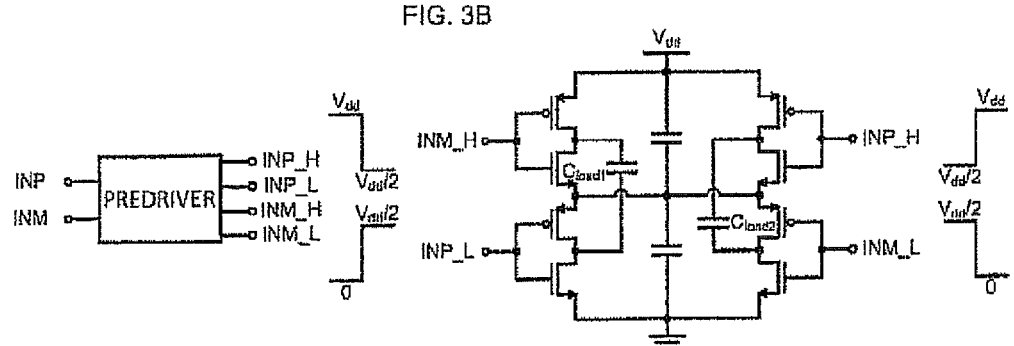
Figure 3D:
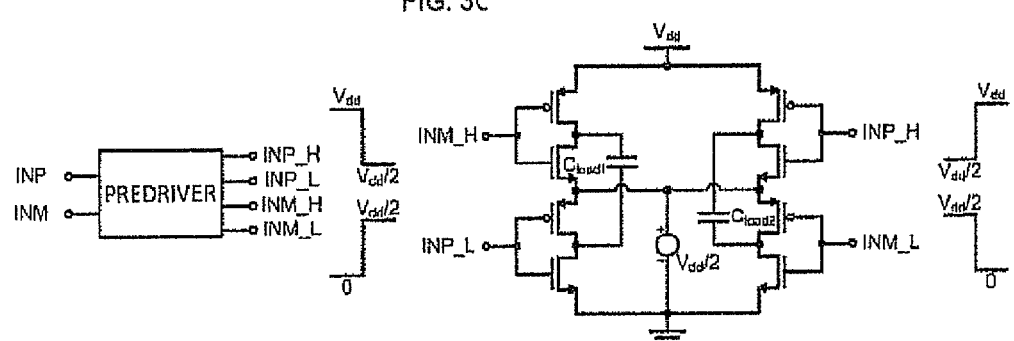

FIGS. 3a-3d are schematic diagrams of several embodiments of the E-O interface driver of this disclosure. With reference to FIG. 3a, in a case of an OOK input signal on the differential input nodes INP and INM, the driver provides a differential voltage equal to 0 or to Vdd between the two terminals of each load Cload1 and Cload2 (to the cathode and the anode in the case of a reverse biased junction) that are driven as a function of the signal pairs INM_H-INP_L and INP_H-INM_L generated in a pre-driver stage, in phase opposition. Each branch of the output driver stage includes four stacked MOS transistors, typically two stacked CMOS inverters, as indicated in the alternative embodiments illustrated in FIGS. 3a-3d. The mid branch nodes A and B may be left floating, though it may be preferable that they are connected, either separately or together, to a Vdd/2 supply node, or to a capacitance connected to Vdd and/or Gnd, to reduce significant voltage swings on the A and B nodes during operation.

Figures 4A, 4B:
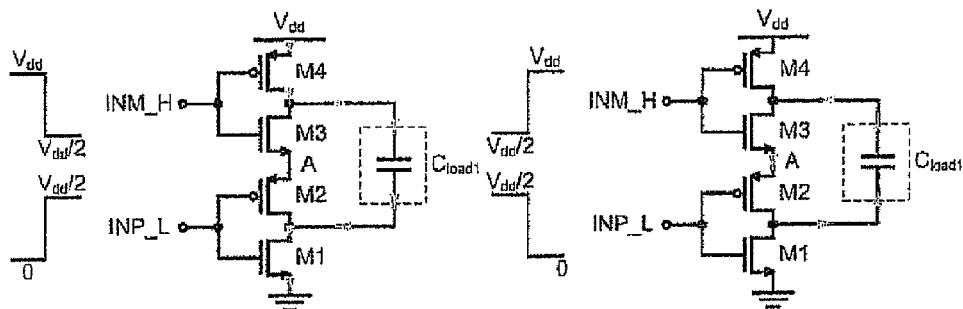
FIG. 4a is a schematic circuit diagram showing current flows during a charging phase of the driver according to an embodiment of the present invention.
FIG. 4b is a schematic circuit diagram showing current flows during a discharging phase of the drive according to an embodiment of the present invention.

In an embodiment, the four signals INM_L INP_L INM_H INP_H that control the MOS transistors of the two branches are synchronous (i.e. with no delay from one another) differential voltages with a Vdd/2 swing each and DC shifted one from the other by a DC voltage equal to Vdd/2. During operation of the driver, the current flows in the output stage as indicated by arrow heads in FIGS. 4a and 4b, where only a single branch is shown for the sake of simplicity.

At the rising edge of the INP_L signal (synchronous with the falling edge of the INM_H signal) the load capacitance is charged, drawing current from Vdd to Gnd through M1 and M4. When the differential voltage at the load terminals reaches the desired value (Vdd), no more current is drawn from the supply, and a charge is stored in the load capacitance. At the falling edge of the INP_L signal (synchronous with the rising edge of the INM_H signal), the load capacitance is discharged, shorting the capacitance through M3 and M2.

The other branch of the driver stage works in phase opposition with respect to the previously described one. This makes the driver increasingly efficient because almost all the current drawn from the supply is used to charge the capacitive load, and almost no current from the supply is used during the discharging phase. This represents an advantage e.g. from CML implementations, where the differential pair bias current is drawn during both the charging and the discharging phases.

Moreover, the driver topology generally allows the use of only thin oxide transistors (which may be ideally suited for high speed operations) for generating relatively large swing output signals (e.g. twice the nominal maximum supply voltage of thin oxide transistors) while providing increasingly safe operation of the transistors. Exceeding SOA limits can be reduced or avoided in standard CMOS technologies, where, contrary to SOI technology products, the bulk nodes of the NMOS transistors are not isolated by inserting the upper NMOS transistors (M3 and its dual) inside a triple-well. Matching between the upper and lower NMOS transistors can be further improved by also inserting the lower NMOS transistors (M1 and its dual) inside a triple-well.

Figure 5:
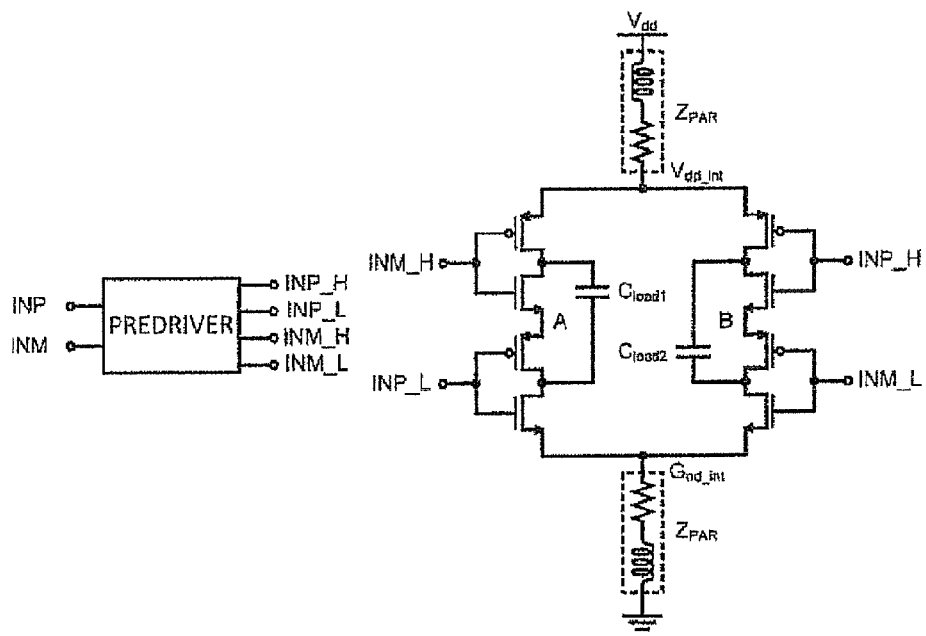
FIG. 5 is a schematic circuit diagram showing the parasitic series impedances on the Vdd and Gnd lines according to an embodiment of the present invention.

The driver structure can be further improved to reduce the impact, especially at high frequencies, of the parasitic impedances of the Vdd and Gnd lines. In fact, the signal path between Vdd and Gnd is generally a relatively good short circuit only at low frequencies, but it is generally not well characterized at frequencies in the range of tens of GHz: this effect can be modeled by two impedances $Z_{PAR}$ in series with Vdd and Gnd, as shown in FIG. 5, whose value cannot be easily characterized.

This results in a not easily predictable degradation of the horizontal and vertical openings of the output eye diagram (Jitter and Vertical Eye Closure Penalty). A low impedance signal path between the Vdd and Gnd nodes can be formed by adding a bypass capacitance between the Vdd_int and Gnd int nodes, as shown in FIG. 6a.

Figure 6B:
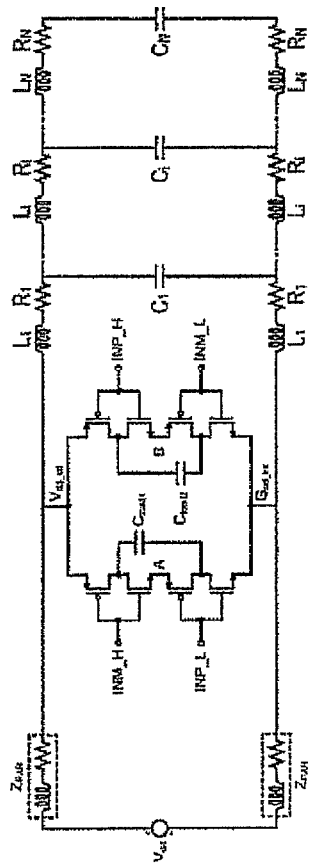
FIG. 6b is a schematic circuit diagram of a bypass capacitance between supply rails in form of a distributed structure according to an embodiment of the present invention.
Figure 6A:
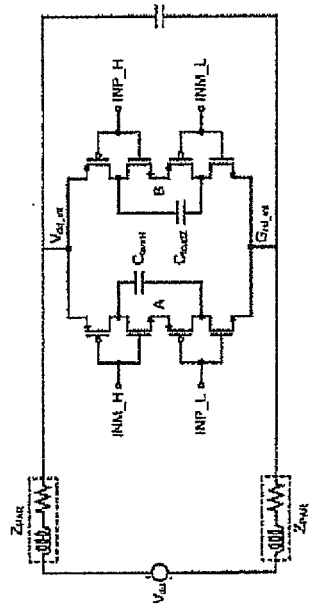
FIG. 6a is a schematic circuit diagram of a bypass capacitance between supply rails in form of a lumped structure according to an embodiment of the present invention.
Figure 7A:
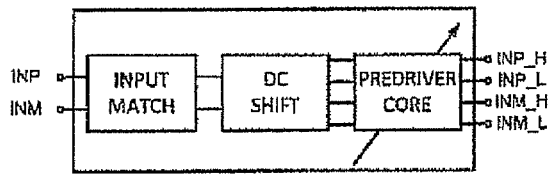
FIG. 7a is a schematic block diagram of a pre-driver according to an embodiment of the present invention.
Figure 7B:
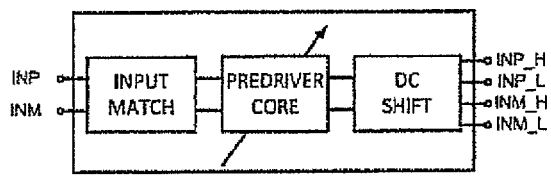
FIG. 7b is a schematic block diagram of a pre-driver according to another embodiment of the present invention.

A further enhanced predictability of the bypass effect up to frequencies of tens of GHz may be achieved by substituting a lumped bypass capacitance with a distributed R-L-C structure, formed, for example, with alternated transmission lines and lumped capacitances, as shown in FIG. 6b, making up for the total capacitance value. The two differential voltages at the input of the two driver branches are provided by a pre-driver, the functions of which are: providing the four desired input signals to the input of the output driver stage starting from a differential input signal (in the case of a single-ended input signal, an additional single-ended to differential converter may be desirable); adding a programmable delay in the signal propagation from the input to the output of the pre-driver; and realizing, if needed, an input impedance matching. Two alternative embodiments of the pre-driver are shown in FIGS. 7a and 7b.

The DC SHIFT functional block generates a differential signal with '0' and '1' logical levels equal to Vdd/2 and Vdd, respectively, starting from a differential signal with '0' and '1' logical levels equal to Gnd and Vdd/2, respectively. The DC SHIFT circuitry can be formed with circuits using pre-charged capacitances. Pre-charging the capacitances to Vdd/2, either through purposely designed topologies or by explicitly adding pre-charging circuits, reduces SOA violations both during normal operation as well as at the startup. Two examples of circuit implementations of the desired DC shift are illustrated in FIGS. 8a and 8b.

Figure 8A:
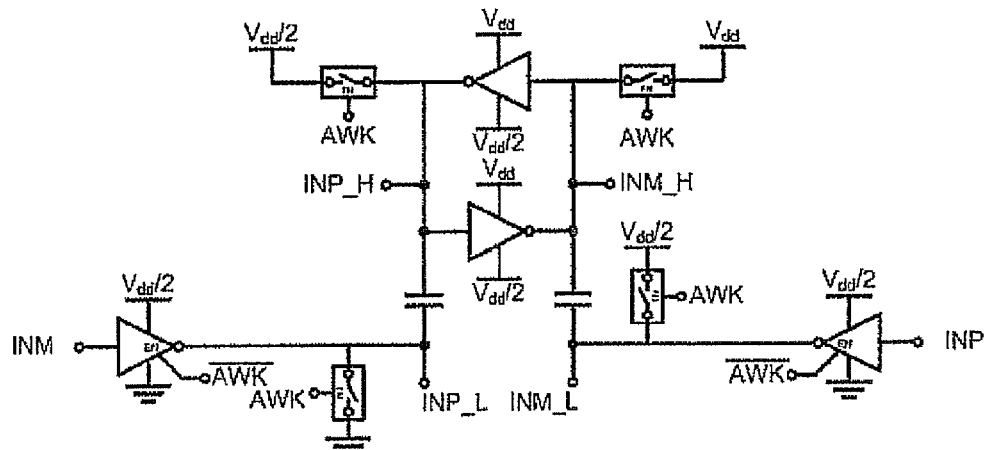
FIG. 8a is a schematic circuit diagram of the DC-shift function of the pre-driver according to an embodiment of the present invention.

In the circuit in FIG. 8a, at the start-up (AWK at '1' level) a switching network is used to pre-charge the two capacitances to Vdd/2, while disconnecting the input signals. During normal operation (AWK at '0' level), the switches are turned off, the input signals are connected, and the charge stored in the capacitances allows to DC shift the two input signals, with an inversion forced by the input inverter. When the input signal INM is at Gnd, the signal INP_L is at Vdd/2, and the output INP_H is at Vdd. When the input signal INM is at Vdd/2, the signal INP_L is at Gnd and the output INP_H is at Vdd/2. The latch, made of a pair of back-to-back inverters, reduces the need for any capacitance re-charging during operation, even in the presence of long sequences of equal bits, maintaining the two output signals in phase opposition with each other and reducing any SOA violation in the transistors of the latch itself.

Figure 8B:
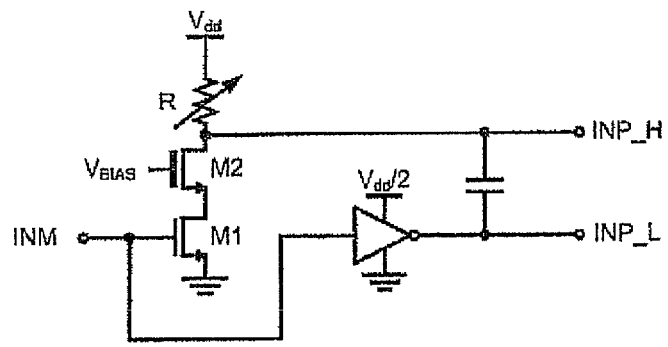
FIG. 8b is a schematic circuit diagram of the DC-shift function of the pre-driver according to an embodiment of the present invention.

In the circuit of FIG. 8b, where, for the sake of simplicity only one single-ended path is shown, there is no dedicated circuitry for capacitance pre-charge at start-up. The resistance is properly sized to ensure a Vdd/2 output when the input is at '1' level, and its value is preferably made programmable to maintain this condition over PVT variations. The resistance programming can be implemented through a properly designed control loop. The M2 transistor is a relatively thick oxide transistor, with proper gate voltage biasing (e.g. vdd/2) to reduce M1 violations of SOA. Two parallel paths are formed, a slow one (through M1, M2, R), and a fast one (through the inverter and the capacitance). The charge stored in the capacitance allows the fast path to form the desired DC shift of the input signal (with an inversion). When the input signal INM is at Gnd, the output INP_H is forced at Vdd. When the input signal INM is at Vdd/2, the output INPH is forced at Vdd/2.

The pre-driver core amplifies the input signal up to the desired rail-to-rail output levels. It may be formed, for example, as a chain of CMOS inverter stages.

In case it is desired by the application, e.g. to equalize the optical delay of the light propagating within MZM optical guides with the delay of the electrical signal propagating within the driver, the pre-driver core can be used to introduce a pre-defined delay between the input signal and the output signal. For example, the CMOS inverter stages can implement bias current control (e.g. current starved inverter) or load control (e.g. shunt capacitance) techniques to tune the inverter delays and eventually correct for delay variations due to PVT spreads.

If desired by the application, the driver can make use of input impedance matching structures for proper feeding of the input signal also at frequencies of tens of GHz (e.g. adapted to synthesize a single-ended 500 impedance, or a differential 1000 impedance). Of course, a single ended implementation of the same driver stage may be formed using just one branch of the circuit illustrated in FIGS. 3a-3d, with the corresponding bypass structure between Vdd and Gnd as illustrated in FIGS. 6a and 6b. In this case, the pre-driver stage receives at the input a single-ended signal and, in addition to previously shown features, provides inverts the signal INP_L to the signal INM_H and, if needed, also includes an additional programmable delay stage for synchronicity between the INP_L and INM_H signals over PVT spreads.

That which is claimed is:

1. An integrated electro-optical modulator interface comprising:
   a two-branch output stage comprising a plurality of thin oxide CMOS transistors configured to generate rail-to-rail output swings larger than twice a nominal limit of a supply voltage of said plurality of thin oxide CMOS transistors, each branch of said two-branch output stage comprising two stacked CMOS inverter pairs from among said plurality of thin oxide CMOS transistors;
   said two stacked CMOS inverter pairs of a given branch being configured to drive a respective load capacitance, in phase opposition to the other branch; and
   a pre-driver circuit configured to receive a differential modulating signal and output, to respective inputs of said two stacked CMOS inverters, two synchronous differential voltage drive signals having a swing of half the supply voltage and being DC-shifted by half of the supply voltage with respect to each other.

2. The integrated electro-optical modulator interface of claim 1, further comprising circuitry tying middle nodes of each branch of said two-branch output stage to one of respective supply voltage rails and an additional half supply voltage rail.

3. The integrated electro-optical modulator interface of claim 1, further comprising one of a lumped bypass capacitance and a distributed R-L-C structure including a plurality of lumped capacitances coupled in a low impedance signal path at a high frequency between respective supply voltage rails.

4. The integrated electro-optical modulator interface of claim 1, wherein said pre-driver circuit comprises an input impedance matching stage, a DC shifting stage coupled to said input impedance matching stage, and a signal amplification core stage coupled to said input impedance matching stage.

5. The integrated electro-optical modulator interface of claim 4, wherein said DC shifting stage comprises a plurality of capacitances configured to be pre-charged to half the supply voltage.

6. The integrated electro-optical modulator interface of claim 5, wherein said DC shifting stage further comprises a plurality of back-to-back inverter latches configured to maintain a charge of said plurality of capacitances and maintain the two synchronous differential voltage drive signals in phase opposition.

7. An electro-optical modulator interface comprising:
   a two-branch output stage, each branch comprising a plurality of stacked CMOS inverter pairs;
   said plurality of stacked CMOS inverter pairs of a given branch being configured to drive a respective load capacitance in phase opposition to the other branch; and
   a pre-driver circuit coupled to said plurality of stacked CMOS inverter pairs and configured to generate two synchronous differential voltage drive signals having a swing of half a supply voltage and being DC-shifted by half of the supply voltage with respect to each other.

8. The electro-optical modulator interface of claim 7, further comprising circuitry coupling middle nodes of each branch of said two-branch output stage to one of respective supply voltage rails and an additional half supply voltage rail.

9. The electro-optical modulator interface of claim 7, further comprising one of a lumped bypass capacitance and a distributed R-L-C structure comprising a plurality of lumped capacitances coupled between respective supply voltage rails.

10. The electro-optical modulator interface of claim 7, wherein said pre-driver circuit comprises an input impedance matching stage, a DC shifting stage coupled to said input impedance matching stage, and a signal amplification core stage coupled to said input impedance matching stage.

11. The electro-optical modulator interface of claim 10, wherein said DC shifting stage comprises a plurality of capacitances configured to be pre-charged to half the supply voltage.

12. The electro-optical modulator interface of claim 11, wherein said DC shifting stage further comprises back-to-back inverter latches configured to maintain a charge of said plurality of capacitances and maintain the two synchronous differential voltage drive signals in phase opposition.

13. A method of electro-optical interfacing using an electro-optical modulator interface comprising a two-branch output stage, each branch comprising a plurality of stacked CMOS inverter pairs, the method comprising:

driving, using the plurality of stacked CMOS inverter pairs of a given branch, a respective load capacitance coupled between an output of each of the plurality of stacked CMOS inverter pairs in phase opposition to the other branch; and generating, using a pre-driver circuit coupled to the plurality of stacked CMOS inverter pairs, two synchronous differential voltage drive signals having a swing of half a supply voltage and being DC-shifted by half of the supply voltage with respect to each other.

14. The method of claim 13 wherein the pre-driver circuit comprises an input impedance matching stage, a DC shifting stage coupled to said input impedance matching stage, and a signal amplification core stage coupled to said input impedance matching stage.

15. The method of claim 14, further comprising pre-charging a plurality of capacitances of the DC shifting stage to half the supply voltage.

16. The method of claim 15, further comprising maintaining, using back-to-back inverter latches of the DC shifting stage, a charge of the plurality of capacitances and maintaining the two synchronous differential voltage drive signals in phase opposition.

\* \* \* \* \*